United States Patent
Tsuno

Patent Number: 6,111,253
Date of Patent: Aug. 29, 2000

[54] TRANSMISSION ELECTRON MICROSCOPE

[75] Inventor: Katsushige Tsuno, Tokyo, Japan

[73] Assignee: JEOL Ltd., Tokyo, Japan

[21] Appl. No.: 09/143,288

[22] Filed: Aug. 28, 1998

[30] Foreign Application Priority Data

Sep. 1, 1997 [JP] Japan .................... 9-235806

[51] Int. Cl.$^7$ .................... H01J 49/00
[52] U.S. Cl. .................... 250/311
[58] Field of Search .................... 250/311, 305, 250/310, 396 R

[56] References Cited

U.S. PATENT DOCUMENTS 4,153,844  5/1979  Kirschner .................... 250/492.1
4,742,223  5/1988  Kesmodel .................... 250/305

OTHER PUBLICATIONS

"Performance of a new high–resolution electron energy–loss spectroscopy microscope", Masami Terauchi et al., *Microsc. Microanal. Microstruct.*, 2 (1991) 351–358.

*Primary Examiner*—Kiet T. Nguyen
*Attorney, Agent, or Firm*—Webb Ziesenheim Logsdon Orkin & Hanson, P.C.

[57] ABSTRACT

A transmission electron microscope that produces a monochromated electron beam and thus has improved spatial resolution. This microscope has a retarding monochromator mounted between the first anode (extraction electrode) of a field emission gun (FEG) and the second anode. The monochromator includes a decelerating portion, a Wien filter and an accelerating portion. An exit slit is so positioned that this exit slit and the object plane of the monochromator are symmetrical with respect to the center of the Wien filter. The beam extracted by the cathode of the gun is monochromated by the monochromator and so the chromatic aberrations can be improved. Consequently, the spatial resolution can be improved.

6 Claims, 5 Drawing Sheets

TRANSMISSION ELECTRON MICROSCOPE

BACKGROUND OF THE INVENTION

1. Field of the Invention

The present invention relates to a transmission electron microscope (TEM).

2. Description of the Prior Art

FIG. 4 schematically shows a high-spatial resolution TEM. This microscope has an electron gun 1, an accelerating portion 2 for accelerating electrons, an aperture 3, condenser lenses 4, objective lenses 5 and a specimen stage 6. Projector lenses, a fluorescent screen, and other components located downstream of the specimen stage 6 are omitted in FIG. 4. The side of the electron gun as viewed in the direction of the optical axis is referred to as the "upstream" side herein. The opposite side is referred to as the "downstream" side herein. Accordingly, the condenser lenses 4 are positioned upstream of the objective lenses 5 and downstream of the accelerating portion 2.

The electron beam emitted by the electron gun 1 is accelerated with a given accelerating voltage by the accelerating portion 2. In the high-spatial resolution TEM, it is usual to set the accelerating voltage to more than 200 kV. Therefore, the electron beam is accelerated with a given accelerating voltage of more than 200 kV. The accelerating portion 2 is usually composed of plural accelerating tubes to avoid internal electric discharge. Each individual accelerating tube is omitted in FIG. 4; rather these tubes are collectively shown as one block.

FIG. 5 shows the structure of the accelerating portion 2 using an $LaB_6$ gun that is one kind of thermionic electron gun. In this structure, the gun is composed of a first anode and the following five accelerating electrodes, or five accelerating tubes. A field emission gun (FEG) is often used as the electron gun 1.

The electron beam accelerated with the given accelerating voltage by the accelerating portion 2 passes through the aperture 3 and is converged by the condenser lenses 4. The beam then reaches the specimen stage 6 through the objective lenses 5. Usually, the condenser lenses 4 are composed of plural stages of lenses. However, the lenses are collectively shown as one block in FIG. 4. Similarly, the objective lenses 5 are shown as one block.

The electron guns of these structures have been improved. Also, the structures of the various lenses typified by the objective lenses 5 have been studied to improve the spherical aberrations and the chromatic aberrations. As a result, the spatial resolution has been improved. Since the present invention does not lie in improvements in electron guns, they are not discussed in detail herein. It can be considered that the spherical aberrations of the objective lenses 5 have been reduced to an infinitesimal level. However, we have found that there remains room for improvements in chromatic aberrations.

SUMMARY OF THE INVENTION

It is an object of the present invention to provide a transmission electron microscope having improved spatial resolution by improving chromatic aberrations. The amount of chromatic aberrations is proportional to chromatic aberration coefficients, the ratio of the energy spread of the electron beam to the accelerating voltage and the aperture angle of the electron beam. Among these factors, the energy spread of the electron beam is narrowed by a monochromator in the following method.

This object is achieved by a transmission electron microscope using an accelerating voltage of more than 200 kV and needing multistage acceleration, the microscope being characterized in that a monochromator is mounted upstream of a specimen stage. The monochromator can be mounted between the specimen stage and the accelerating portion for accelerating the electron beam with a given accelerating voltage. The monochromator may also be mounted upstream of the accelerating portion. In this case, the monochromator can be mounted between the first and second anodes of the electron gun.

Where the monochromator is mounted between the first and second anodes of the electron gun, a slit mounted on the exit side of the monochromator to select a desired energy of the electron beam may be positioned either upstream or downstream of the accelerating portion.

The monochromator has a decelerating portion for decelerating the electron beam incident on the monochromator and an accelerating portion for accelerating the electron beam going out of the monochromator. The decelerating portion may be made up of plural stages of decelerating electrodes. The accelerating portion may be composed of plural stages of accelerating electrodes. A Wien filter can be used as this monochromator.

The accelerating portion may be omitted and the downstream accelerating portion of the body of the transmission electron microscope may act also as this accelerating portion.

Other objects and features of the invention will appear in the course of the description thereof which follows.

DETAILED DESCRIPTION OF THE PREFERRED EMBODIMENTS

The principle of the present invention is first described. It is known that the amount of chromatic aberrations is in proportion to the energy spread of the electron beam. That is, the electron beam does not have a uniform energy but is distributed over a certain energy range about a certain energy value. The amount of chromatic aberrations is in proportion to the energy spread.

Accordingly, it can be seen that the amount of chromatic aberrations can be reduced by reducing the energy spread of the electron beam. In consequence, the spatial resolution can be improved. That is, the electron beam is made more monochromatic.

Where a cold field emission gun (FEG) is used, the energy spread of the electron beam emitted by the electron gun is about 0.4 eV, which is an optimum value. A high-resolution TEM adopting such a field emission gun (FEG) and designed optimally has a spatial resolution approaching 0.1 nm.

A monochromator can be used to render the electron beam monochromatic. A filter, such as a Wien filter or an ω-filter, capable of passing only a charged beam having energies satisfying certain conditions can be used as the monochromator. The Wien filter that is simple in structure is used below.

It can be seen from the discussion made thus far that the monochromator preferably has greater energy dispersion, because it is easier to obtain an electron beam having a desired energy if the monochromator has greater energy dispersion. However, if one tries to obtain an electron beam having an energy of 200 keV from a transmission electron microscope with an accelerating voltage of 200 kV simply by using a Wien filter, the length of the Wien filter taken along the optical axis is very large, making the instrument unpractical.

Figure 6:
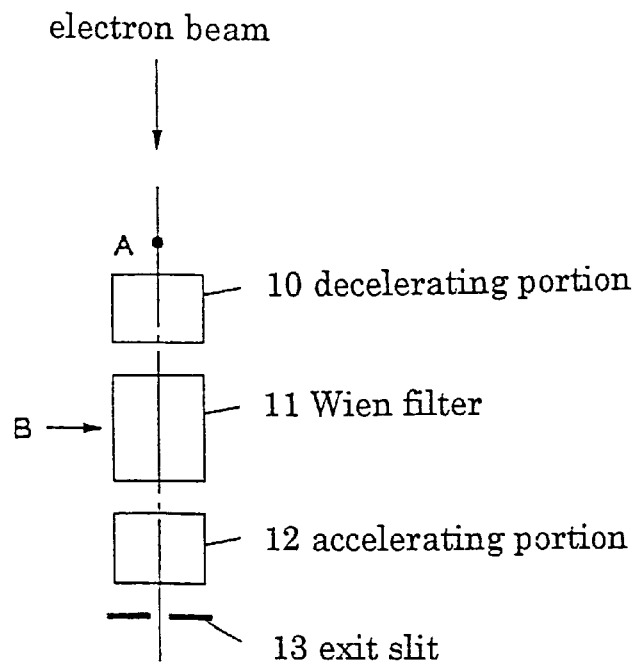
FIG. 6 is a schematic view of a retarding monochromator.
Figure 5:
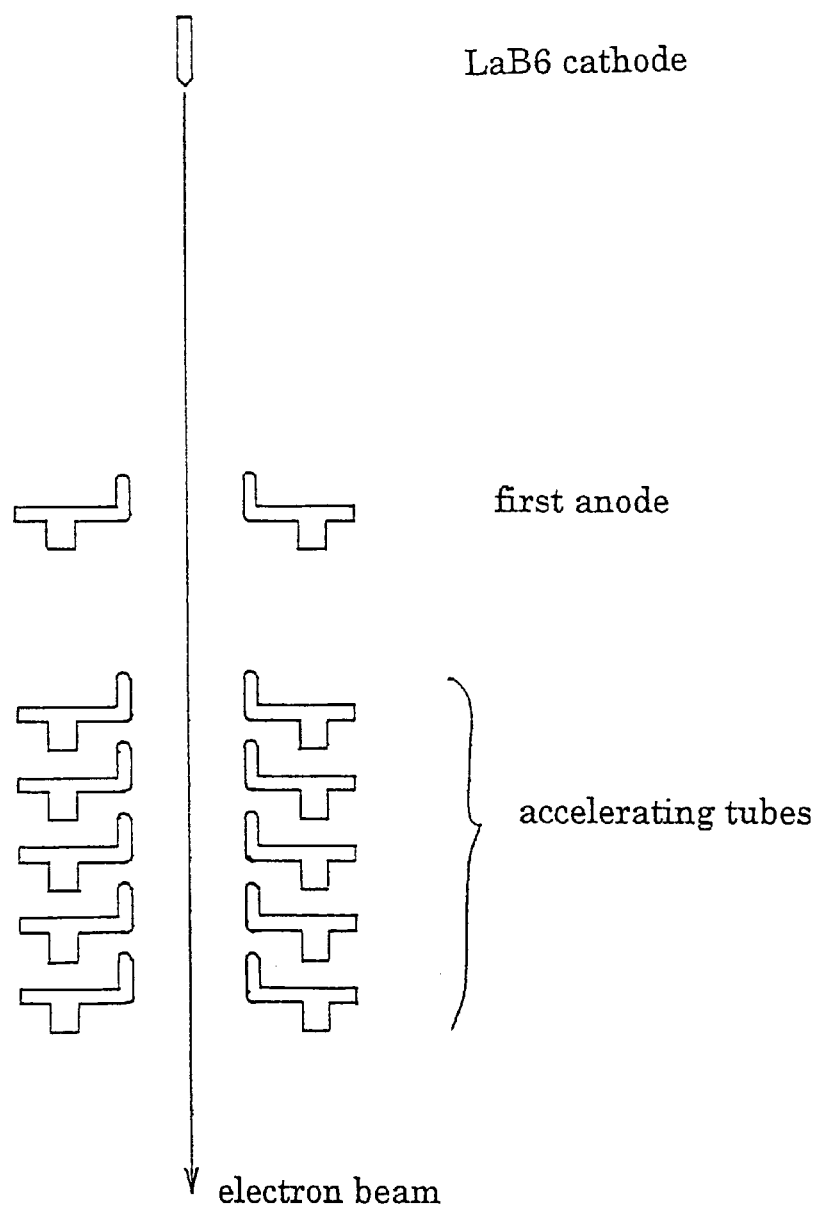
FIG. 5 is a schematic view of the accelerating portion of the microscope shown in FIG. 4.
Figure 7:
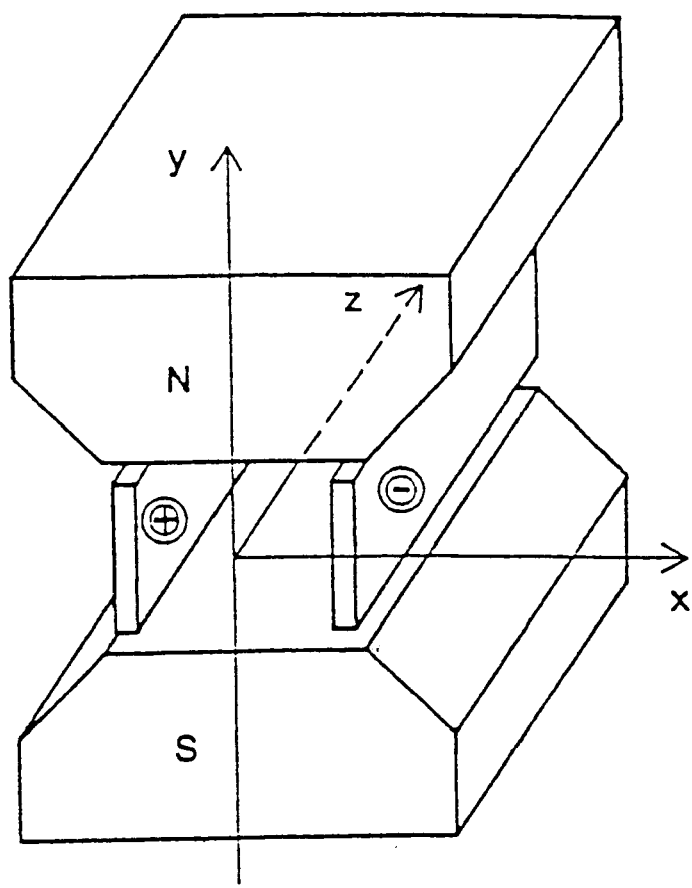
FIG. 7 is a schematic view of a Wien filter incorporated in the retarding monochromator shown in FIG. 6.

Accordingly, it is desired to use the retarding type as the monochromator. One example of this is shown in FIG. 6, where a Wien filter, indicated by 11, is used as a monochromator. The instrument has a decelerating portion 10, an accelerating portion 12, and an exit slit 13, as well as the Wien filter 11. FIG. 7 illustrates the structure of the Wien filter 11. The optical axis of the electron beam is indicated by z. A pair of magnetic poles, N and S, is formed. Also, a pair of electrodes, indicated by + and − each surrounded by a double circle, is formed.

Where the accelerating voltage is in excess of 200 kV, the decelerating portion 10 and the accelerating portion 12 provide several stages of deceleration and several stages of acceleration, respectively, in the same way as the accelerating portion of the body of the transmission electron microscope. The decelerating portion and the accelerating portion shown in FIG. 5 may be used intact as the decelerating portion and the accelerating portion, respectively, of these multistage electrode structures.

In FIG. 6, the electron beam is decelerated to about 1 keV or less, preferably about 500 eV or less, further preferably about 20 to 200 eV by the decelerating portion 10 and enters the Wien filter 11. In this filter 11, only the electrons of the electron beam having energies satisfying the Wien condition travel straight and are accelerated by the accelerating portion 12 up to energies prior to entry into the decelerating portion 10. Then, the electrons exit from the exit slit 13. This slit 13 has a function of selecting the energy of the outgoing electron beam from the electron beam energy dispersed by the Wien filter 11. In FIG. 6, the object plane of the retarding monochromator is located at a point A. The center of the Wien filter 11 is positioned at a point B. If the exit slit 13 is so positioned that this exit slit 13 and the point A are symmetrical with respect to the point B, many aberration coefficients can be reduced to zero and a good operation condition can be obtained.

The configuration shown in FIG. 6 is equivalent to one generally known as the retarding Wien filter. With the monochromator of this configuration, the electron beam is decelerated and then the energy is dispersed by the Wien filter 11. It is possible to select the energy of the outgoing electron beam with the exit slit 13. Hence, the electron beam can be well monochromated. The principle of the present invention has been described thus far. Some embodiments of the present invention are given below.

Figure 1:
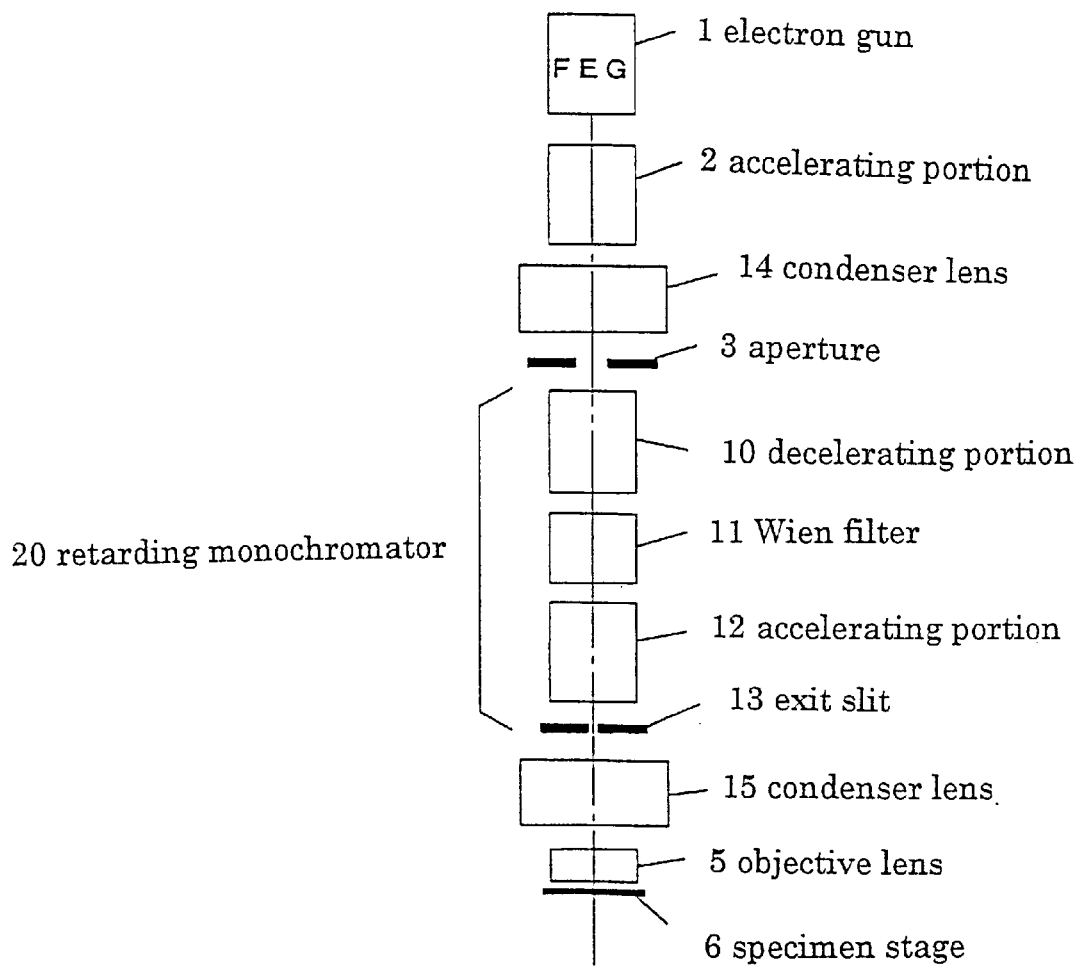
FIG. 1 is a diagram of a transmission electron microscope in accordance with the present invention.

Referring to FIG. 1, there is shown a transmission electron microscope in accordance with the present invention. This instrument includes condenser lenses 14, 15 and a retarding monochromator 20. It is to be noted that like components are indicated by like reference numerals in various figures. The microscope uses an electron gun 1 that is a field emission gun (FEG). Obviously, an $LaB_6$ gun or other electron gun can also be used. The accelerating voltage is 200 kV. In this embodiment, the retarding monochromator 20 is located between the accelerating portion 2 and the specimen stage 6.

The electron beam emitted from the electron gun 1 is accelerated to the accelerating voltage, or 200 kV, by the accelerating portion 2. The beam is then converged by the condenser lens 14 and enters the retarding monochromator 20 through the aperture 3. In the same way as in FIG. 6, the retarding monochromator 20 comprises the decelerating portion 10, the Wien filter 11, the accelerating portion 12, and the exit slit 13. This exit slit 13 is so positioned that the slit 13 and the object plane (not shown in FIG. 1) of the retarding monochromator 20 are symmetrical with respect to the Wien filter 11.

Since the accelerating voltage is as high as 200 kV, the decelerating portion 10 and the accelerating portion 12 of the monochromator 20, as well as the accelerating portion 2, use accelerating tubes consisting of several stages of accelerating electrodes as described previously in connection with FIG. 5.

The electron beam going out of the retarding monochromator 20 is focused by the condenser lens 15 and passed to the specimen stage 6 via the objective lenses 5. Although each of the condenser lenses 14 and 15 is composed of plural stages of lenses, they are collectively shown as one block in FIG. 1.

Figure 2:
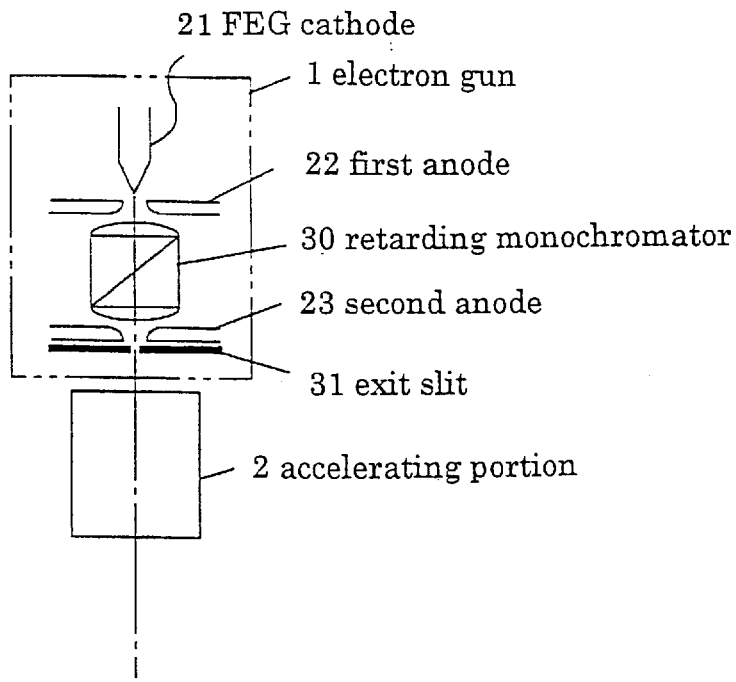
FIG. 2 is a diagram of another transmission electron microscope in accordance with the present invention.

In this configuration, the electron beam is well monochromated by the retarding monochromator 20 before impinging on the specimen stage 6. Therefore, the chromatic aberrations can be improved. This makes it possible to enhance the spatial resolution. In practice, the monochromator was introduced in a high-resolution TEM designed optimally. An electron beam having an energy spread of less than 0.1 eV was obtained. The spatial resolution reached 0.03 nm. Referring next to FIG. 2, there is shown another transmission electron microscope in accordance with the invention. This microscope also uses an electron gun 1 that is a field emission gun (FEG) having a cathode 21. The instrument further includes a first anode 22, a second anode 23, a retarding monochromator portion 30, and an exit slit 31. This instrument shown in FIG. 2 is similar to the instrument already described in connection with FIG. 1 in other respects.

In this geometry, the retarding monochromator portion 30 is located between the first anode 22 of the field emission gun (FEG) and the second anode 23. Although the retarding monochromator portion 30 is shown as one block in FIG. 2, a decelerating portion, a Wien filter and an accelerating portion are incorporated in the monochromator portion. This retarding monochromator portion 30 and the exit slit 31 located downstream of the second anode 23 together form a retarding monochromator. This exit slit 31 is so positioned that this slit 31 and the object plane (not shown in FIG. 2) of the retarding monochromator portion 30 are symmetrical with respect to the Wien filter.

The exit slit 31 is disposed downstream of the second anode 23 to assure that the exit slit and the object plane are placed symmetrically. Where the structure of the instrument should be simplified, the exit slit 31 can be placed upstream of the second anode 23 instead of downstream of it.

Furthermore, the first electrode of the accelerating portion can act also as the second anode 23.

The first anode 22 acts to extract the electron beam from the cathode 21 and is sometimes referred to as the extraction electrode. Usually, the voltage (extraction voltage) applied to the first anode 22 is approximately 2 to 4 kV. The second anode 23 accelerates the electron beam extracted from the cathode 21 up to a desired energy.

Figure 4:
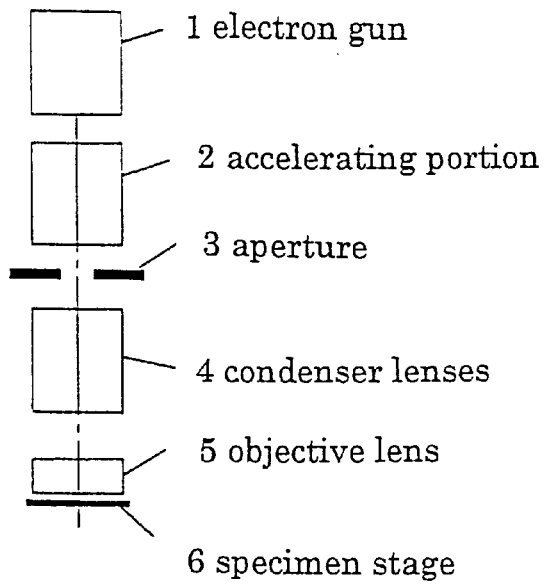
FIG. 4 is a schematic diagram of the prior art high spatial-resolution transmission electron microscope.

In this geometry, the retarding monochromator is incorporated in the field emission gun (FEG). The electron beam extracted from the cathode 21 of the gun is monochromated by the retarding monochromator portion 30, passes through the second anode 23 and the exit slit 31 and is accelerated to the desired accelerating voltage by the accelerating portion 2. Consequently, the chromatic aberrations can be improved. As a result, the spatial resolution can be improved. The downstream side of the accelerating portion 2 is the same as the downstream side shown in FIG. 4.

This transmission electron microscope can be made smaller than the instrument shown in FIG. 1. In particular, the accelerating voltage of the microscope shown in FIG. 1 is set to 200 kV. The accelerating portion 2 is made up of plural accelerating tubes as mentioned previously. The accelerating portion 2 for accelerating the electron beam with 200 kV has a large length in the direction of the optical axis. The electron beam accelerated by the accelerating portion 2 impinges on the retarding monochromator 20. The decelerating portion 10 needs to decelerate the beam to about 1 keV or less, preferably about 500 eV or less, further preferably about 20 to 200 eV. For this purpose, the length of the decelerating portion 10 taken in the direction of the optical axis needs to be comparable to the length of the accelerating portion 2. Hence, this decelerating portion 10 is inevitably large. Furthermore, the length of the accelerating portion 12 taken in the direction of the optical axis needs to be comparable to the length of the decelerating portion 10. Therefore, the accelerating portion 12 is also large. In this way, with the structure shown in FIG. 1, the microscope column of the TEM is very large.

On the other hand, the voltage applied to the first anode 22 of the field emission gun (FEG) is, as mentioned above, about 2 to 4 kV, which is not sufficiently low for the purpose that the electron beam can be well monochromated by a monochromator having no decelerating portion, but two orders of magnitude smaller than the accelerating voltage. Where the retarding monochromator portion 30 is disposed immediately downstream of the first anode 22 as shown in FIG. 2, the lengths of the decelerating portion and the accelerating portion of this monochromator portion 30 taken in the direction of the optical axis can be made smaller than in the case of FIG. 1. Consequently, the microscope column of this transmission electron microscope can be shortened.

The accelerating portion of the retarding monochromator portion 30 may be omitted and the downstream accelerating portion of the body of the transmission electron microscope may act also as this accelerating portion. It is also conceivable that the exit slit 31 is located immediately upstream of the second anode 23 instead of immediately downstream of the second anode 23. This can simplify the structure further.

Figure 3:
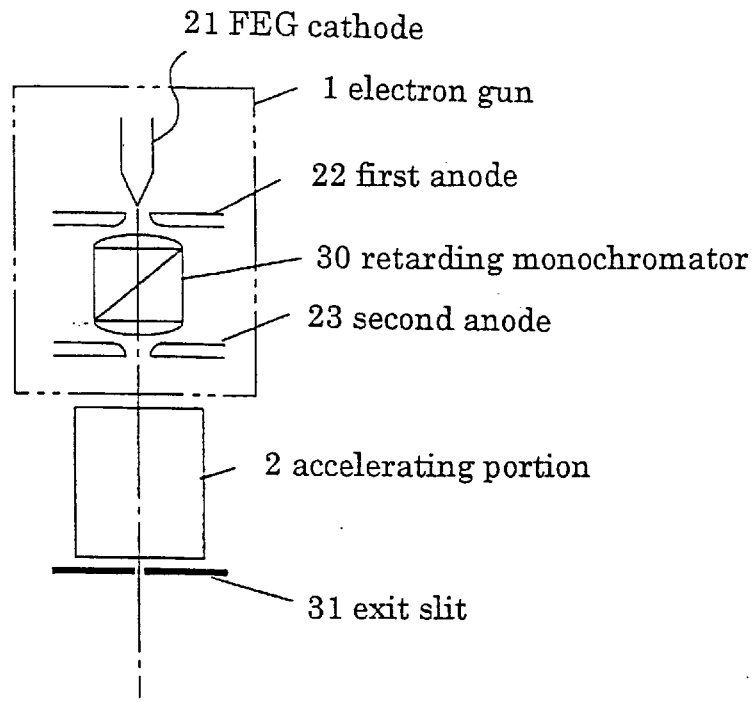
FIG. 3 is a diagram of a further transmission electron microscope in accordance with the present invention.

Referring next to FIG. 3, there is shown a further transmission electron microscope in accordance with the invention. This microscope is similar to the instrument shown in FIG. 2 except for the position of the exit slit 31. In particular, in the geometry shown in FIG. 2, the exit slit 31 is located immediately downstream of the second anode 23. In FIG. 3, the exit slit 31 is positioned downstream of the accelerating portion 2. Also, in this structure shown in FIG. 3, the electron beam is monochromated and thus the chromatic aberrations can be improved. Hence, the spatial resolution can be enhanced.

This structure is intended to save the cost. In the structure shown in FIG. 2, the exit slit 31 is located upstream of the accelerating portion 2 and so the slit 31 is placed in a high voltage of nearly 200 kV. This makes it impossible to manually operate the exit slit 31. Therefore, the exit slit 31 has to be operated under automatic control with some mechanism. A control unit for this automatic control, its power supply and other components are placed in the high accelerating voltage applied to the accelerating portion 2. This increases the cost accordingly.

On the other hand, where the exit slit 31 is positioned downstream of the accelerating portion 2 as shown in FIG. 3, the accelerating tube at the lowest stage of the accelerating portion 2 is grounded and, therefore, this exit slit 31 can be manually operated. Consequently, a control unit for automatically controlling the exit slit 31, its power supply, a mechanism for driving the exit slit 31 and so on are all dispensed with unlike the structure shown in FIG. 2. Hence, the cost can be curtailed.

Note that the geometry shown in FIG. 3 cannot satisfy the symmetrical condition. That is, the exit slit 31 and the object plane (not shown in FIG. 3) should be located symmetrically with respect to the center of the Wien filter of the retarding monochromator portion 30. Therefore, the instrument must be used under a defocused condition. Even if the instrument is focused, it cannot meet the symmetrical condition and so the second-order aberration of the retarding monochromator will increase. However, the chromatic aberrations can be improved and hence the spatial resolution can be improved.

While some embodiments of the present invention have been described thus far, it will be evident to those skilled in the art that the invention is not limited thereby, but various changes and modifications are possible. Especially, the position of the retarding monochromator is not restricted to the positions described in the above embodiments. Rather, any appropriate position may be selected as long as it is located upstream of the specimen stage.

Having thus described my invention with the detail and particularity required by the Patent Laws, what is desired protected by Letters Patent is set forth in the following claims.

What is claimed is:

1. A transmission electron microscope comprising:
   a first accelerating portion for accelerating an electron beam with a given accelerating voltage of 200 kv or more;
   a specimen stage; and
   a retarding monochromator located upstream of said specimen stage and consisting of a decelerating portion for decelerating the electron beam incident on said monochromator, an aperture located upstream of said decelerating portion to limit a desired size of said electron beam incident on said monochromator, a second accelerating portion for accelerating the electron beam going out of said monochromator and an exit slit located downstream of said accelerating portion to select a desired energy of said electron beam.

2. The transmission electron microscope of claim 1, wherein said monochromator is mounted between said first accelerating portion and said specimen stage.

3. The transmission electron microscope of claim 1 or 2, wherein said decelerating portion of said retarding monochromator consists of plural stages of decelerating electrodes, and wherein said second accelerating portion consists of plural stages of accelerating electrodes.

4. A transmission electron microscope comprising:
   an accelerating portion for accelerating an electron beam with a given accelerating voltage; and
   a retarding monochromator located upstream of said accelerating portion and consisting of a decelerating portion for decelerating the electron beam incident on said monochromator and an exit slit located downstream of said accelerating portion to select a desired energy of said electron beam.

5. The transmission electron microscope of claim 4, wherein said electron beam is produced by an electron gun having first and second anodes, and wherein said monochromator is mounted between said first and second anodes of said electron gun.

6. The transmission electron microscope of claim 4, wherein said electron beam is produced by an electron gun having an extraction electrode, and wherein said monochromator is mounted between said extraction electrode and said accelerating portion.

* * * * *